(12) United States Patent
Hoshina

(10) Patent No.: US 8,174,038 B2
(45) Date of Patent: May 8, 2012

(54) LIGHT EMITTING DEVICE

(75) Inventor: Takaharu Hoshina, Ichihara (JP)

(73) Assignee: Showa Denko K.K., Tokyo (JP)

( * ) Notice: Subject to any disclaimer, the term of this patent is extended or adjusted under 35 U.S.C. 154(b) by 209 days.

(21) Appl. No.: 12/278,320

(22) PCT Filed: Feb. 5, 2007

(86) PCT No.: PCT/JP2007/052429
§ 371 (c)(1),
(2), (4) Date: Aug. 5, 2008

(87) PCT Pub. No.: WO2007/091696
PCT Pub. Date: Aug. 16, 2007

(65) Prior Publication Data
US 2009/0078957 A1    Mar. 26, 2009

Related U.S. Application Data

(60) Provisional application No. 60/775,798, filed on Feb. 23, 2006.

(30) Foreign Application Priority Data

Feb. 6, 2006  (JP) ................................ 2006-028589

(51) Int. Cl.
*H01L 33/00*    (2010.01)
(52) U.S. Cl. ..................... 257/98; 257/99; 257/E33.067
(58) Field of Classification Search .................. 257/98, 257/E33.056, E33.058, E33.067, 99
See application file for complete search history.

(56) References Cited

U.S. PATENT DOCUMENTS

| | | | |
|---|---|---|---|
| 2002/0109184 A1 | 8/2002 | Hower et al. | |
| 2002/0134988 A1* | 9/2002 | Ishinaga | 257/99 |
| 2005/0023543 A1 | 2/2005 | Konno | |
| 2005/0045896 A1* | 3/2005 | Goh et al. | 257/98 |
| 2005/0133804 A1 | 6/2005 | Hsu et al. | |
| 2005/0146879 A1* | 7/2005 | Takahashi et al. | 362/296 |
| 2006/0028730 A1* | 2/2006 | Varaprasad et al. | 359/604 |
| 2006/0054913 A1* | 3/2006 | Hadame et al. | 257/99 |
| 2006/0124945 A1 | 6/2006 | Baur et al. | |
| 2006/0131594 A1* | 6/2006 | Yano et al. | 257/89 |
| 2007/0085103 A1 | 4/2007 | Nishioka et al. | |
| 2008/0237617 A1* | 10/2008 | Itoh et al. | 257/98 |

FOREIGN PATENT DOCUMENTS

| | | |
|---|---|---|
| JP | 2002-533956 A | 10/2002 |
| JP | 2005-019695 A | 1/2005 |
| JP | 2005-166733 A | 6/2005 |
| JP | 2006-501656 A | 1/2006 |
| TW | 200520271 A | 6/2005 |
| TW | 1246781 B | 1/2006 |
| TW | 1246782 B | 1/2006 |

* cited by examiner

*Primary Examiner* — Wael Fahmy
*Assistant Examiner* — Sarah Salerno
(74) *Attorney, Agent, or Firm* — Sughrue Mion, PLLC

(57) ABSTRACT

A light emitting device includes a board, a semiconductor light emitting element formed on the board optionally via a submount, a cap sealing the semiconductor light emitting element and a reflector provided surrounding the cap. The cap has top and bottom surfaces that are parallel to the top surface of the semiconductor light emitting element, and the spacing between the top and bottom surfaces is 1-3 times the longest diagonal or the diameter of the semiconductor light emitting element. Also disclosed is a process for producing the device.

8 Claims, 10 Drawing Sheets

LIGHT EMITTING DEVICE

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/775,798 filed on Feb. 23, 2006, pursuant to 35 U.S.C. §111(b).

TECHNICAL FIELD

The present invention relates to a light emitting device and, particularly, to a light emitting device with enhanced light extraction efficiency. The efficiency is improved by reducing the self-absorption of light from a light emitting element due to total reflection of light at the light extraction surface formed by a lens or sealing material covering the light emitting element.

BACKGROUND ART

Examples of known light emitting devices employing light emitting elements include a light emitting device such as that shown in FIG. 1 which has a lamp-type light emitting diode mounted on a lead frame and sealed in resin, and a light emitting device such as shown in FIG. 2 which has a board, provided with a reflector, with a light emitting element mounted on the board at the bottom of a depression formed by the board and reflector, and a resin seal either at the interior or over the entirety of the depression. In these figures, 2 is a light emitting element, 4 is a board, 5 is a reflector, 6 is a sealing compound, 7 is a mount-side lead frame, 8 is a power supply-side lead frame, 9 is a bonding wire, 10 is a p-electrode and 11 is an n-electrode. In such light emitting devices, a material having a refractive index intermediate between the light emitting element and air is employed as the sealing material in order to reduce total reflection in the light emitting element, but self-absorption of light from the light emitting element also occurs, along the beam trajectory indicated by A in FIG. 1, thereby lowering the efficiency and specifically resulting in light extraction efficiency that is only about 1.2-1.5 times that achieved without sealing.

The refractive index of a light emitting element usually is a value of 2.4-3.7, while the refractive index of air is 1.0. The resin used as the sealing resin is usually one with a refractive index between these, of about 1.5. For light emitted from the light emitting element to exit from the sealing resin into the air, the angle ($\theta$) formed by the interface between the sealing resin and the air and light impinging on that interface must be larger than the critical angle ($\theta_c$) represented by the following formula.

$$\theta_c = \cos^{-1}(n_2/n_1)$$

(where $n_1$ is the refractive index on the incident side, and $n_2$ is the refractive index on the outgoing side.)

The critical angle ($\theta_c$) calculated from the refractive index of the sealing resin is approximately 48°, and light will not exit the sealing resin if the angle between the interface and the incident beam, as measured from the interface (reflection surface) in the direction of the normal to the interface, is smaller than that value. Since the p-type layer, n-type layer and active layer forming a light emitting element generally exhibit photoabsorption rates of $1\times10$-$1\times10^4$/cm, multiple reflection of photons in the sealing resin leads to absorption in the light emitting element, thus inhibiting light extraction.

It is known that in light emitting elements, adjustment of the geometric dimensions such as the height of the upper clad layer with respect to the active layer and the angles of the element sides can improve the light extraction efficiency compared to conventional rectangular light emitting elements (for example, see U.S. Pat. Nos. 6,229,160; 6,323,063; and 6,570,190). However, adjustment of the geometric dimensions in a light emitting element-mounted light emitting device for enhancement of light extraction efficiency has not been known.

DISCLOSURE OF THE INVENTION

It is an object of the present invention to provide a light emitting device with excellent light extraction efficiency due to reduced self-absorption of light from the light emitting element.

According to the present invention, the spacing between the top and bottom surfaces of the cap is a specific length and a specified distance is provided between the light emitting element and the cap top surface (light extraction surface), while the cap shape is also modified to reduce self-absorption of light from the light emitting element and enhance the light extraction efficiency. Specifically, the invention provides the following.

(1) A light emitting device comprising a board, a semiconductor light emitting element formed on the board optionally via a submount, a cap sealing the semiconductor light emitting element and a reflector provided surrounding the cap, wherein the cap has top and bottom surfaces that are parallel to the top surface of the semiconductor light emitting element, and the spacing between the top and bottom surfaces is 1-3 times the longest diagonal or the diameter of the semiconductor light emitting element.

(2) A light emitting device according to claim 1, wherein the area ratio of the top and bottom surfaces of the cap (top surface/bottom surface) is 4 or greater.

(3) A light emitting device according to claim 1 or 2, wherein the ratio between the lengths of the corresponding sides or the diameters of the top and bottom surfaces of the cap (top surface/bottom surface) is 2 or greater.

(4) A light emitting device according to any one of claims 1 to 3, wherein the angle formed between the top surface and sides of the cap is 40° or smaller.

(5) A light emitting device according to claim 1, wherein the area ratio of the top and bottom surfaces of the cap (top surface/bottom surface) is 1/4 or smaller.

(6) A light emitting device according to claim 1 or 5, wherein the ratio between the lengths of the corresponding sides or the diameters of the top and bottom surfaces of the cap (top surface/bottom surface) is 1/2 or smaller.

(7) A light emitting device according to any one of claims 1, 5 and 6, wherein the angle formed between the top surface and sides of the cap is 140° or larger.

(8) A process for production of a light emitting device comprising the following steps (1) to (4).

(1) A step of mounting a semiconductor light emitting element on a board optionally via a submount;

(2) a step of mounting a reflector on the board;

(3) a step of forming a cap according to any one of claims 1 to 7; and (4) a step of bonding the cap onto the semiconductor light emitting element with a material having a refractive index that is not more than the refractive index of the cap.

According to the light emitting device of the invention, the spacing (height) between the top and bottom surfaces of the cap is set to be greater than the longest diagonal or the diameter of the light emitting element, whereby light emitted from the light emitting element is efficiently extracted from the sealed structure and self-absorption of light from the light emitting element is prevented to enhance the light extraction efficiency. Furthermore, by forming a suitable angle between the sides and top surface of the cap, it is possible to further enhance the light extraction efficiency.

In addition, the light emitting element is sealed in a manner that also enhances light extraction efficiency and the light emitting element is situated at the focus of a parabolic reflector, in order to provide a light emitting device with high front brightness.

BEST MODE FOR CARRYING OUT THE INVENTION

Figure 14:
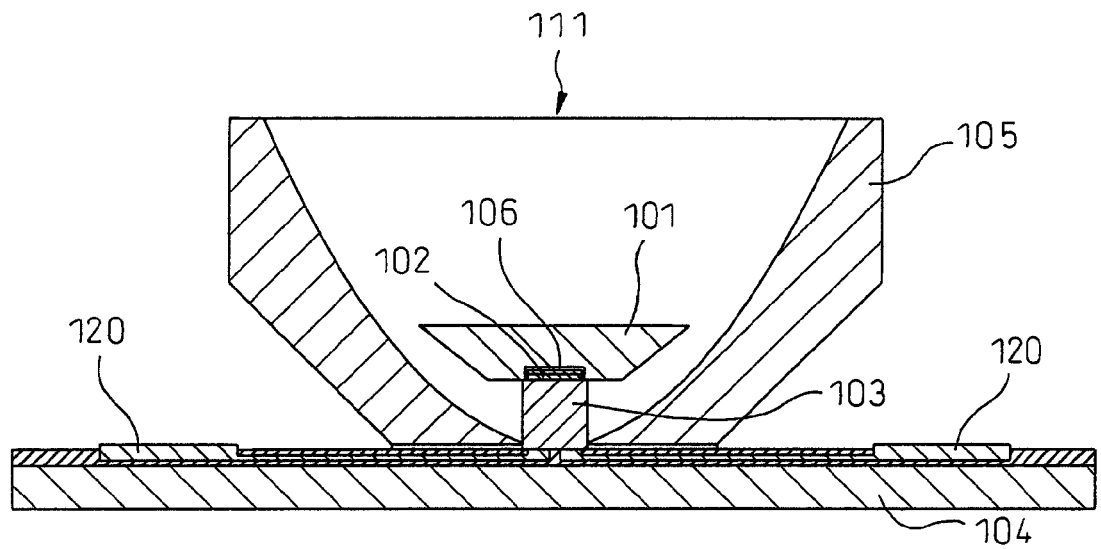
FIG. 14 is a cross-sectional view of the light emitting device fabricated in Example 1.

FIG. 14 is an illustration of an embodiment of a light emitting device of the invention, showing a cross-sectional view of the light emitting device 111 prepared in Example 1. In this drawing, 101 is a cap, 102 is a semiconductor light emitting element, 103 is a submount, 104 is a radiating board, 105 is a reflector and 106 is a sealing compound.

Figure 1:
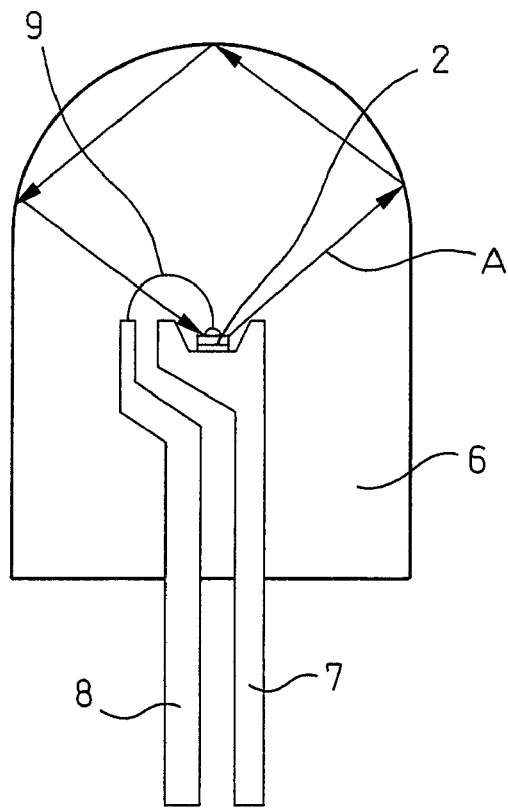
FIG. 1 is an illustration showing an example of a conventional light emitting device.
Figure 2:
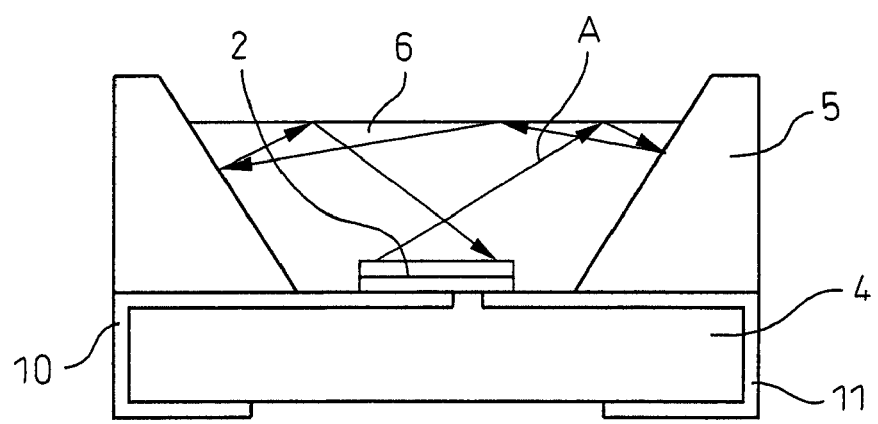
FIG. 2 is an illustration showing another example of a conventional light emitting device.
Figure 3:
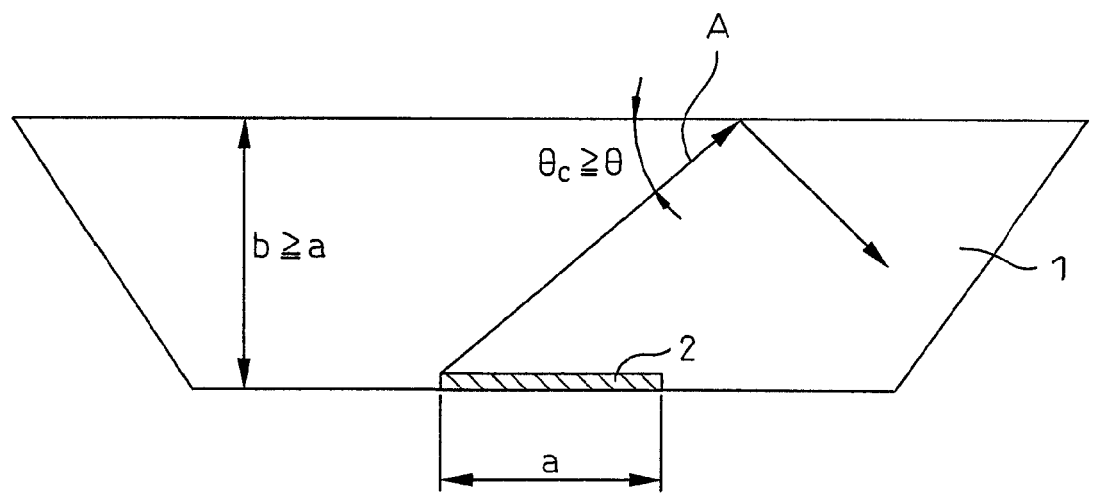
FIG. 3 is a cross-sectional view of an example of a cap according to the invention.

FIG. 3 is a schematic view showing a partial cross-section of the cap and light emitting element of FIG. 14. The invention according to (1) above is characterized in that light extraction from the light emitting element is enhanced by having a spacing (b) between the top and bottom surfaces of the cap (1) that is specified to be not smaller than the longest diagonal or diameter (a) of the light emitting element (2), as shown in FIG. 3, so that when emitted light (A) from the end of the light emitting element is totally reflected at the top surface of the cap, i.e. the interface between the resin forming the cap and the air, the photons cannot easily return to the light emitting element (2).

Figure 4:
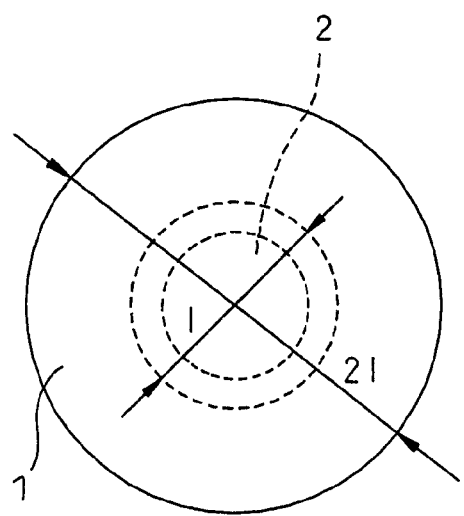
FIG. 4 is a plan view of an example of a cap according to the invention.
Figure 5:
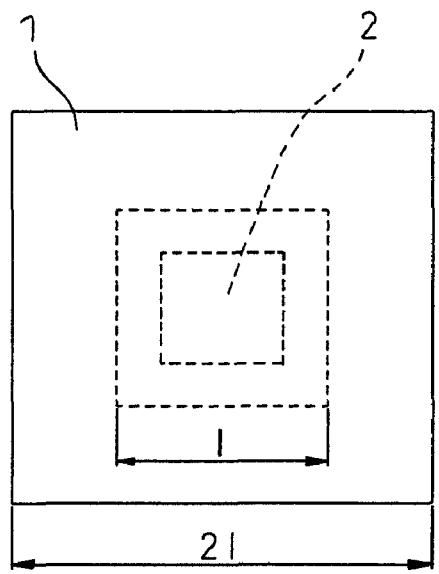
FIG. 5 is a plan view of another example of a cap according to the invention.
Figure 6:
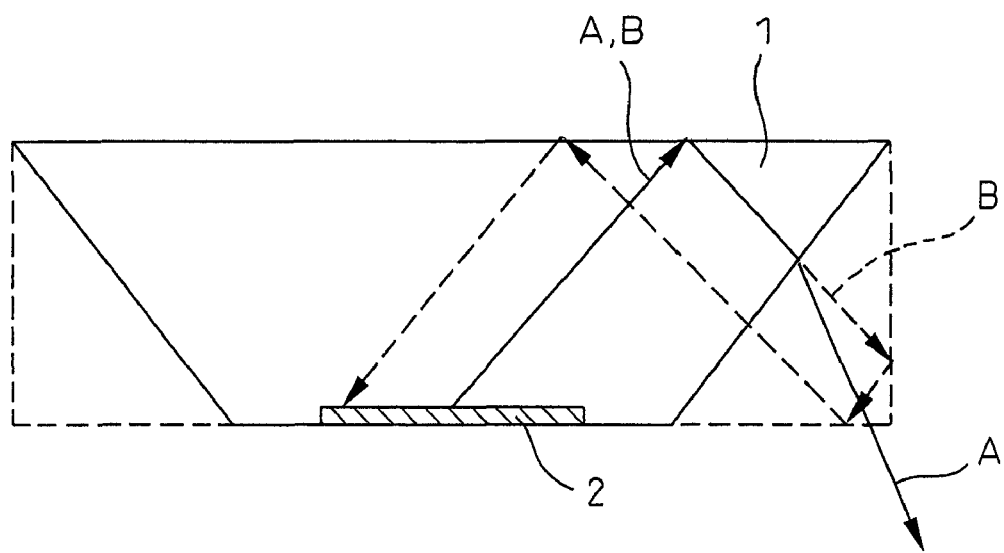
FIG. 6 is a cross-sectional view of the cap shown in FIG. 4 or FIG. 5.

FIG. 4 and FIG. 5 are plan views of an example of a cap (1) according to the invention. FIG. 6 is a cross-sectional view of the same. By specifying that the area ratio of the top and bottom surfaces of the cap is 4:1 or greater or the ratio between the lengths of the sides is 2:1 or greater as according to the invention of (2) and (3) above, while the spacing between the top and bottom surfaces of the cap is not smaller than the longest diagonal or the diameter of the light emitting element, totally reflected light (A) at the top surface of the cap, amongst the light emitted from the light emitting element, has an incident angle at the sides which exceeds the critical angle so that it is extracted out as illustrated in FIG. 6, such that light absorption in the cap and absorption by the light emitting element are prevented and light extraction becomes more efficient.

However, as shown by the broken line in FIG. 6, if the area ratio of the top and bottom surfaces of the cap is 1:1 or the ratio of the lengths of the corresponding sides is 1:1, most of the totally reflected light (B) at the top surface of the cap, amongst the light emitted from the light emitting element, has an incident angle at the sides which is smaller than the critical angle, such that reflection is repeated at the bottom surface and top surface of the cap as illustrated by route B in the drawing, thereby resulting in more absorption of light in the cap and at the light emitting element due to multiple reflection.

Figure 7:
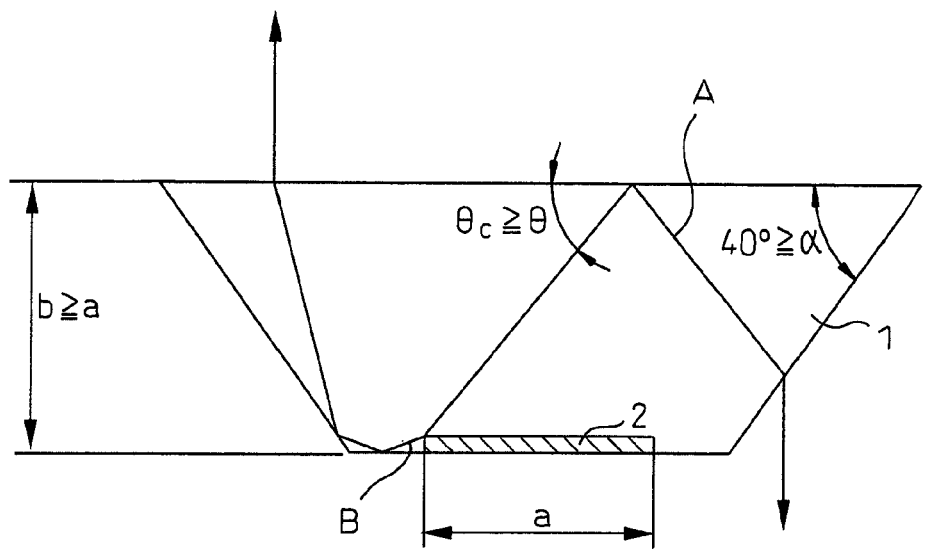
FIG. 7 is a cross-sectional view of another example of a cap according to the invention.
Figure 8:
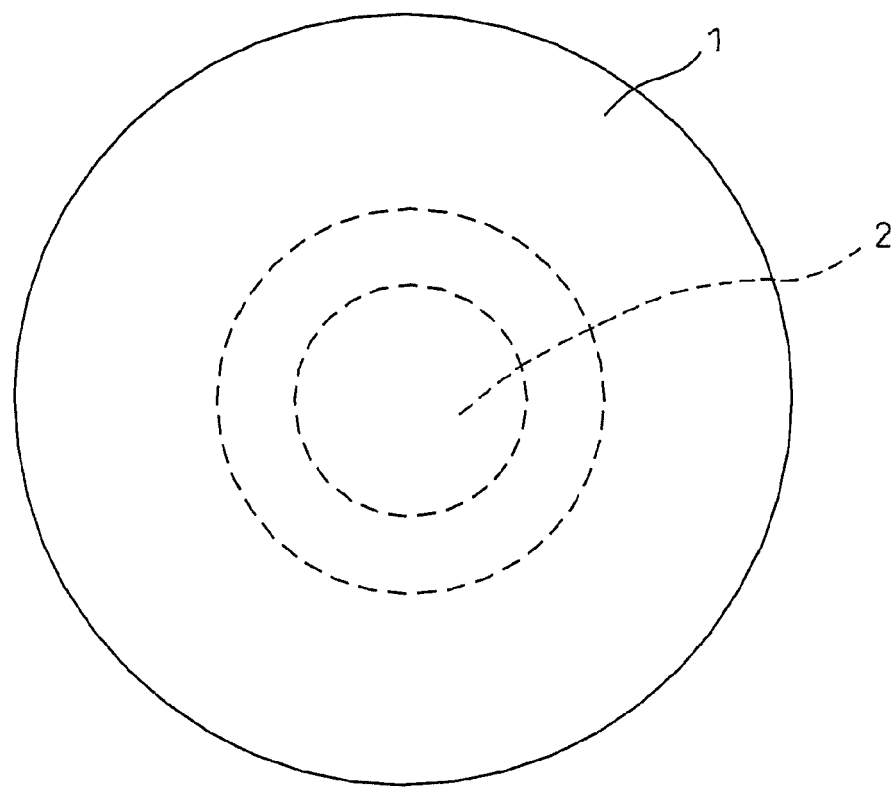
FIG. 8 is a plan view of the cap shown in FIG. 7.

FIG. 7 is a cross-sectional view of a different example of a cap (1) of a light emitting device according to the invention, and FIG. 8 is a plan view of the same. According to the invention of (4) above, the totally reflected light (A) at the top surface of the cap (1) surrounding the light emitting element (2), amongst the light emitted from the light emitting element, is incident to the sides of the cap (1) at greater than the critical angle as illustrated in FIG. 7, so that it is efficiently extracted without being absorbed by the light emitting element. Furthermore, as the thickness of the light emitting element is smaller than its width, light (B) directed toward the bottom surface of the cap is multiply reflected at the bottom surface and sides of the cap but is extracted from the top surface of the cap without being reabsorbed in the light emitting element. Thus, absorption of light by the light emitting element is reduced and light can therefore be more efficiently extracted. The top of the cap is a clipped inverse cone in this example, but the same effect is achieved with an inverse pyramid.

Figure 9:
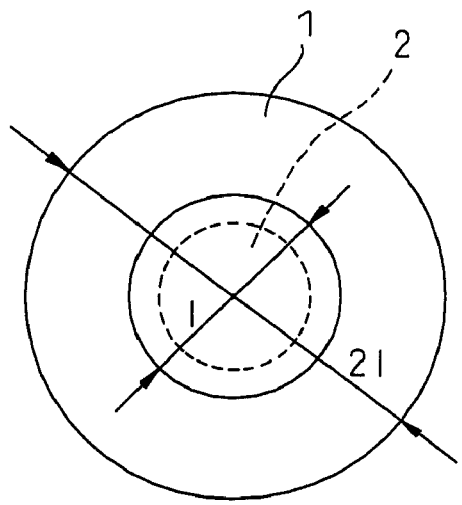
FIG. 9 is a plan view of another example of a cap according to the invention.
Figure 10:
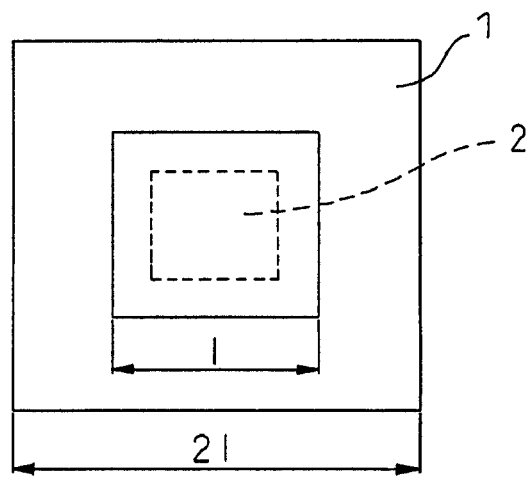
FIG. 10 is a plan view of another example of a cap according to the invention.
Figure 11:
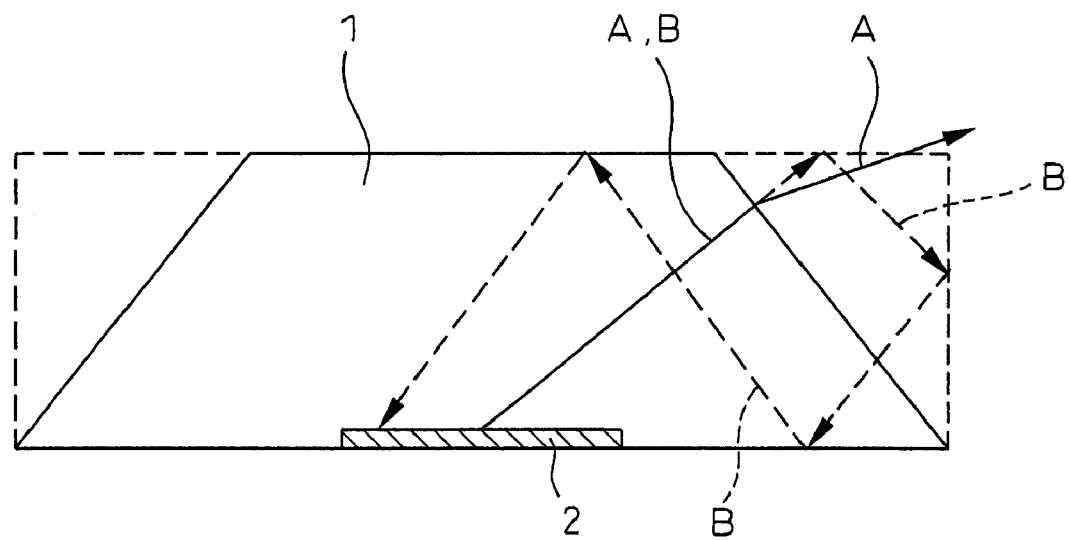
FIG. 11 is a cross-sectional view of the cap shown in FIG. 9 or FIG. 10.

FIG. 9 and FIG. 10 are plan views showing another example of a cap (1) according to the invention. FIG. 11 is a cross-sectional view of the same. By specifying that the area ratio of the top and bottom surfaces of the cap is 1:4 or smaller or the ratio between the lengths of the sides is 1:2 or smaller as according to the invention of (5) and (6) above, while the spacing between the top and bottom surfaces of the cap is not smaller than the longest diagonal or the diameter of the light emitting element, light (A) directed toward the sides of the cap, amongst the light emitted from the light emitting element, has an incident angle which exceeds the critical angle so that it is extracted out as illustrated in FIG. 11, such that light absorption in the cap and absorption by the light emitting element are prevented and light extraction becomes more efficient.

However, as shown by the broken line in FIG. 11, if the area ratio of the top and bottom surfaces of the cap is 1:1 or the ratio of the lengths of the corresponding sides is 1:1, most of the light (B) emitted in the same direction is incident to the top surface of the cap at an incident angle which is smaller than the critical angle, such that reflection is repeated at the sides, bottom surface and top surface of the cap as illustrated by route B in the drawing, thereby resulting in more absorption of light in the cap and at the light emitting element due to multiple reflection.

Figure 12:
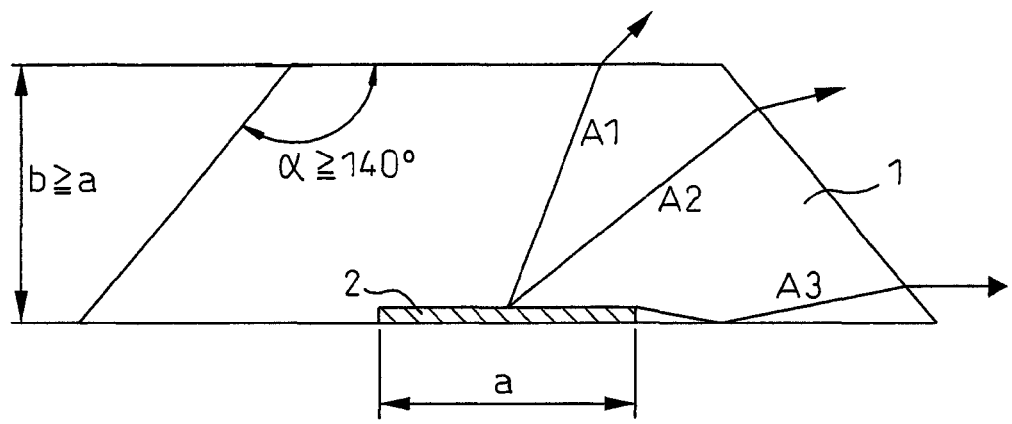
FIG. 12 is a cross-sectional view of another example of a cap according to the invention.
Figure 13:
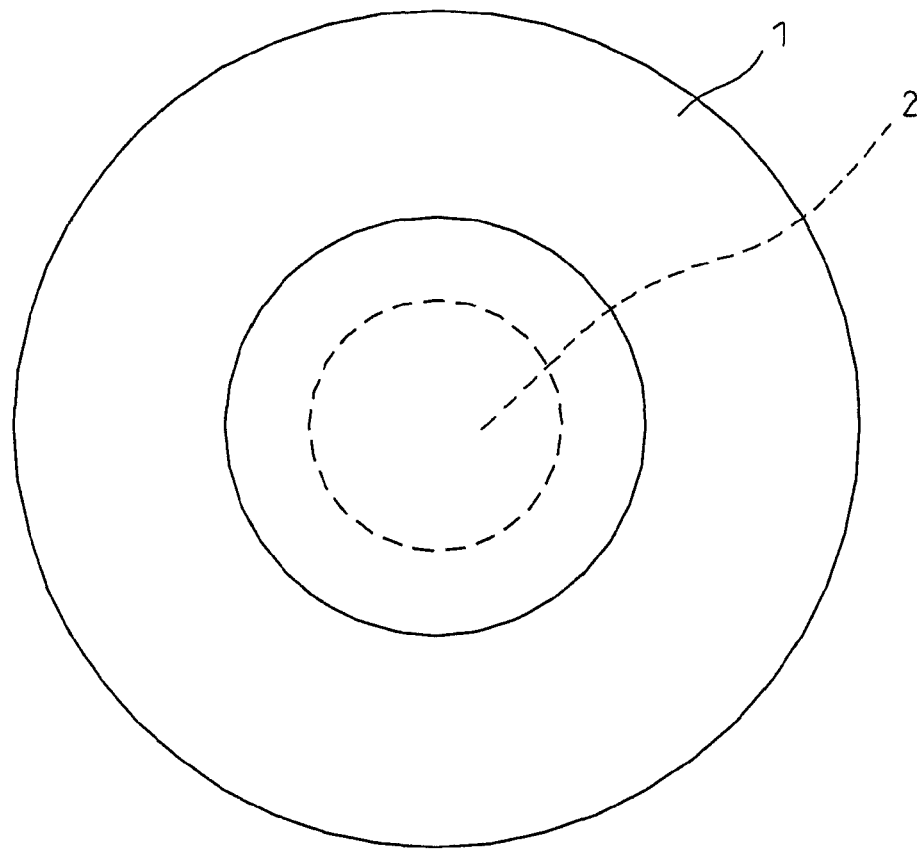
FIG. 13 is a plan view of the cap shown in FIG. 12.

FIG. 12 is a cross-sectional view of a different example of a cap (1) of a light emitting device according to the invention, and FIG. 13 is a plan view of the same. According to the invention of (7) above, the light (A1 and A2) directed from the light emitting element (2) toward the top surface and sides of the cap is incident to each side at greater than the critical angle, as shown in FIG. 12, and can therefore be easily and efficiently extracted outward. Because the thickness of the light emitting element is smaller than its width, the light (A3) directed toward the bottom surface of the cap reaches the sides with a minimal number of reflections. Thus, total reflection is minimal, absorption of light by the light emitting element is reduced and light can therefore be more efficiently extracted. The top of the cap is a clipped cone in this example, but the same effect is achieved with a pyramid.

Each of the members of the light emitting device of the invention will now be explained.

The board on which the reflector and submount are mounted may be a lead frame, printed board or radiating board. A radiating board is preferred because of the large current flowing to the light emitting element.

In the case of a radiating board, a plurality of radiating boards having dimensions reasonably suitable for a light emitting device are molded from a single board by press working with a punch die. The shape of the radiating board may be any desired shape, such as rectangular, circular or polygonal. Press working may also be carried out entirely for completely independent shapes. However, it is preferred to use a plurality of connected rectangular frame shapes that can be loaded onto a mounter having a street formed allowing adjacent sides to be easily cut away. In the case of a radiating board, the punching direction may be selected as a punching direction that does not result in poor adhesion to bonding substrates due to a rebound of the edges after press working. Also preferred are precision punching, opposed die punching and vertical punching to avoid sagging edges.

The radiating board may be a metal base sheet with satisfactory thermal conductivity such as iron, copper or aluminum, instead of a conventional electrical insulating, low-thermal conductivity printed circuit board, and an electrical insulation layer comprising an epoxy resin containing an added aluminum nitride filler with satisfactory thermal conductivity (hereinafter referred to as "thermally conductive resin layer") is coated on one side of it and then a copper electrode circuit is formed thereon by etching, if necessary with reapplication of the thermally conductive resin layer as an electrical insulating protective layer, and formation of a copper circuit for reflector attachment by etching.

The board has a light emitting element fitting section in which the semiconductor light emitting element is mounted. For a radiating board, the light emitting element fitting section comprises an electrical circuit formed using an etching technique on the resin section provided for improved thermal conductivity on the radiating board. Current may be supplied from the electrical circuit to the light emitting element by a wire bond, or an insulating protective film formed on the p and n electrodes of the light emitting element and soldering is carried out to facilitate electrical supply to the light emitting element.

The semiconductor light emitting element may be directly mounted on the board, or it may be mounted via a submount.

The submount is formed of an electrical insulating material, such as a ceramic material, glass epoxy board or insulating protective film-attached Si board, and it has electrical circuits on the front and back surfaces. A ceramic material is preferred from the standpoint of heat dissipation.

For example, aluminum nitride green sheets, which are ceramic materials known for electrical insulation members with satisfactory thermal conductivity, may be prepared as stacked laminates. A circuit pattern is printed on the surface of the sheet, and an electrically conductive cylindrical metal member or "via" is passed through the circuit of each layer to provide continuity of the electrical circuit in the direction of lamination. This can yield a submount with different electrical circuits on the front and back sides. As the laminated sheet will be fired in a tunnel furnace or the like, in order to prevent cracking it is preferably screen printed with a circuit made of a tungsten material which has a coefficient of thermal expansion close to that of aluminum nitride. Preferably, streets are provided between individual submounts to allow a plurality of submounts to be formed from a single green sheet. The tungsten portion used as the circuit may be plated with Ni or Au on the surface for more suitable solder mounting.

The reflector is preferably fabricated using a material with good heat dissipation and workability, for example, a metal material such as copper or aluminum or a ceramic material with good heat dissipation. The process for working of a reflector made of such materials may be cutting of the metal or ceramic for abrasive finishing of the reflection surface, press working of metal for abrasive finishing of the reflection surface, or formation of an aluminum vapor deposition film on the reflection surface by die molding of a thermostable resin, though with slightly inferior heat dissipation. Each reflector may be copper plated on the bonding surface to allow solder mounting on the radiating board.

As explained above, the cap has a clipped inverse conical or inverse pyramidal shape, or a clipped conical or pyramidal shape. Also as mentioned above, the spacing or height between the top and bottom surfaces of the cap is preferably not smaller than the longest diagonal or the diameter of the semiconductor light emitting element. Since light absorption is increased if it is too large, the cap height is preferably no greater than 3 times the longest diagonal or the diameter of the semiconductor light emitting element.

As also explained above, if the cap has an inverse conical shape or inverse pyramidal shape, the area ratio of the top and bottom surfaces of the cap is preferably at least 4:1 or the ratio between the corresponding sides or diameters is preferably at least 2:1. The upper limit for the area ratio or the ratio between the corresponding sides or diameters is not particularly restricted so long as the cap does not impinge on the reflector. The upper limit for the area ratio will usually be about 25:1. In the case of a conical or pyramidal shape, the area ratio between the top and bottom surfaces of the cap is preferably no greater than 1:4 or the ratio between the corresponding sides or the diameters is preferably no greater than 1:2. The lower limit for the area ratio or the ratio between the corresponding sides or diameters is not particularly restricted so long as the cap does not impinge on the reflector. The lower limit for the area ratio will usually be about 1:25.

Furthermore, as explained above, the angle ($\alpha$) formed between the top and side surfaces of the cap is preferably no greater than 40° in the case of an inverse conical or inverse pyramidal shape. The lower limit is not particularly restricted so long as the cap does not impinge on the reflector, but a lower limit of about 30° will usually be applicable. For a conical or pyramidal shape, the angle is preferably at least 140°. The upper limit is not particularly restricted so long as the cap does not impinge on the reflector, but an upper limit of about 150° will usually be applicable.

A depression is formed on the bottom surface of the cap for fitting onto the light emitting device, and the light emitting element is fitted inside the depression. The gap between the cap and the light emitting element is sealed with a sealing compound which also fastens the cap. The sealing compound should be the same material as the cap in order to avoid refractive index changes, but it is more preferably a sealing compound that can soften a shock to the light emitting element. The material forming the cap may be an epoxy-based resin, silicone-based resin or the like, but epoxy-based resins are preferred from the standpoint of moldability.

The cap is fabricated by the following process using the materials described above.

First, a downward-tapered or upward-tapered die is prepared having the dimensions specified above. The die material is preferably tool steel that can be precision mass-produced and has a good mirror-surface property. The inner surface is subjected to lap finishing for transfer of the mirror surface to the product. The die includes a gate, runner and spool and is connected to an injection molding machine, and a resin under heat and pressure is introduced into the die. A heater is installed at the hopper where the starting materials are fed into the injection molding machine, for dehumidifying and predrying. A cooling mechanism is provided in the die, and the process is carried out while adjusting the transparency of the product using the die cooling temperature. The molded product is obtained as a continuous series by the resin flow, and it is subsequently cut and gate finished.

The semiconductor light emitting element used for the invention may be any of a wide range of light emitting elements, such as an AlGaInP-based amber light emitting element, AlGaAs-based red light emitting element, AlGaInP-based red-yellow light emitting element, GaP-based yellow-green light emitting element, GaN-based green light emitting element, GaN-based blue light emitting element, or the like. The flat shape will generally be quadrangular, but it may optionally be polygonal with five or more sides, or circular. The electrode structure may be such where electrodes are on the bottom and top surfaces of the element, or on the same surface.

A procedure for assembly of a light emitting device of the invention from the structural members described above will now be explained.

First, the light emitting element is mounted on the board or submount. The method for mounting the light emitting element on the board or submount may be, for example, vapor deposition of an AuSn eutectic material on the light emitting element electrodes followed by reflowing on the light emitting element fitting section of the board or the submount, or formation of Au bumps on the circuit portion of the light emitting element fitting section of the board or the submount followed by pressure/heat bonding of the light emitting element using ultrasonic waves. The use of an Au material applies for two-stage mounting in which the reflector and submount are mounted on the board using lead-free solder which has a lower melting point than Au-based solder.

The reflector and if necessary the submount are then mounted on the board. The procedure may be as follows.

Solder paste is printed with a screen printer on the submount mount electrode section and reflector mount land section of the radiating board. The printing is carried out with an automatic printer, with multiple boards inserted in the cassette holder. Next, the light emitting element-mounted submount and reflector are mounted in that order on the radiating board using an automatic transfer machine, and the assembly is heated in a reflow furnace to dissolve the soldering agent, after which the temperature is lowered, for mounting.

Finally, the cap is mounted surrounding the light emitting element. The procedure for this may be as follows. A vacuum or mechanical catching mechanism is used to set the depression on the bottom side of the cap facing upward and the cap is filled with the same type of resin as the cap itself or with a resin having a smaller refractive index than the cap, and it is then fitted at the prescribed position of the radiating board on which the positioned reflector, submount and light emitting element have been mounted. For this operation, a suitable amount of resin is supplied in sufficient volume for sealing so as to fill up the gap between the cap and the light emitting element and submount.

The light emitting device of the invention may be used for indoor and outdoor applications including large-sized color displays and traffic signals, in light of the recent development of blue light emitting elements. It may also be used for indoor and outdoor lightings or automobile headlamps employing white LEDs, and therefore has a very wide range of application.

EXAMPLES

The present invention will now be explained in greater detail by examples and comparative examples, with the understanding that the invention is in no way limited only to the examples.

Example 1

Figure 15:
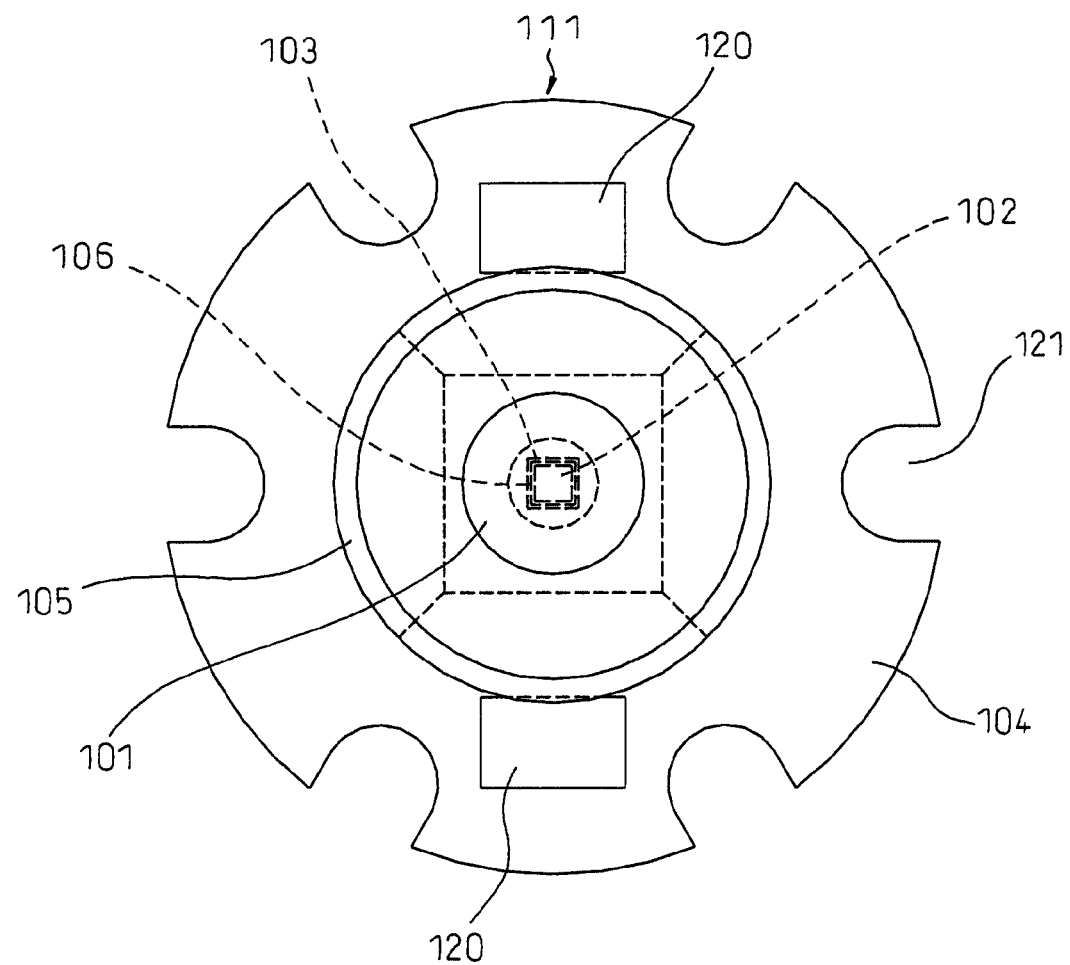
FIG. 15 is a plan view of the light emitting device fabricated in Example 1.

A first example of a light emitting device according to the invention will now be described with reference to the accompanying drawings. FIG. 14 is a cross-sectional view of the light emitting device fabricated in this example, and FIG. 15 is a plan view of the same. The light emitting device 111 is composed of a radiating board 104, reflector 105, submount 103, semiconductor light emitting element 102 and cap 101. The numeral 106 represents a sealing compound. Also, the numeral 120 represents an external power source connection electrode and the numeral 121 represents a heat sink fitting section.

The semiconductor light emitting element 102 used is the GaN-based compound semiconductor blue light emitting element described below, having a square shape with 1 mm×1 mm sides and a thickness of about 90μ.

On a sapphire substrate was stacked a ground layer composed of undoped GaN with a thickness of 8 μm, a Ge-doped n-type GaN contact layer with a thickness of 2 μm, an n-type $In_{0.1}Ga_{0.9}N$ clad layer with a thickness of 0.03 μm, a multiple quantum well structure light emitting layer in which five Si-doped GaN barrier layers with a thickness of 16 nm and five $In_{0.2}Ga_{0.8}N$ well layers with a thickness of 3 nm were stacked alternately and finally the Si-doped GaN barrier layer was stacked, a Mg-doped p-type $Al_{0.07}Ga_{0.93}N$ clad layer with a thickness of 0.01 μm and a Mg-doped p-type AlGaN contact layer with a thickness of 0.15 μm in this order, via an AlN buffer layer, and a positive electrode and a negative electrode were formed on the p-type AlGaN contact layer and the n-type GaN contact layer, respectively, to prepare a light emitting element.

For fabrication of the radiating board 104, a 35 μm-thick electrical insulation layer made of an epoxy-based resin with satisfactory heat conduction by inclusion of an aluminum nitride filler was formed on a 20 mm-diameter disk-shaped, highly thermal conductive aluminum sheet with a thickness of 1.5 mm, and a Cu electrical circuit was formed thereover by an etching method known to those skilled in the art, while an epoxy-based resin electrical insulation layer was formed as a protective layer on the reflector mounting section.

For the reflector 105, a 6 mm-thick aluminum sheet was cut into individual 15 mm-diameter sections with a press, and then parabolic dents with a cross-section of $Y=X^2/4.8$ (Y: height in mm, mm, X: radius in mm) were formed and the inner surfaces were subjected to abrasive finishing with a polishing agent for a paralleling effect on light from the light emitting element. A portion of the bottom surface to be mounted on the board 104 was ground to a diameter of 6 mm.

The submount 103 was made from aluminum nitride, and the cross-section was square with sides of 1.2 mm×1.2 mm and the height was 1.3 mm. The electrical circuit was formed with the semiconductor light emitting element 102 and radiating board 104 electrically connected. The GaN-based blue light emitting element 102 was positioned on the submount so as to be at approximately the beam focus position of the reflector.

The cap 101 was made from an epoxy resin, and had a clipped inverse conical shape of size 1.0 mm base radius×2.0 mm top radius×1.5 mm height. The top/bottom area ratio was therefore 4:1, and the height was greater than the longest diagonal of the light emitting element. A depression was formed at the center of the bottom surface to a size allowing the light emitting element to perfectly fit.

These structural members were used to assemble a light emitting device 111 by the following procedure.

First, the light emitting element 102 was mounted on the submount 103. The specific procedure was as follows. The submount 103 was kept at a temperature of about 200° C. with a heater, and gold bumps were laid with a bump bonder. The bump configuration was a total of 18 gold bumps including one bump at each of the two 0.12 mm square n-electrode positions, and four bumps at each of the four 0.7 mm long× 0.14 mm wide strip p-electrode positions. The bump diameters were 80 μm so as to avoid shorting of the circuit due to deformation of the bumps during contact bonding of the light emitting element. For fitting of the light emitting elements, each light emitting element was seized with a vacuum chuck and bonded on the bump-formed submount by ultrasonic contact bonding while maintaining a load of 300 g, and conditions of 200° C., 138 KHz and 10 mS.

Next, the light emitting element-mounted submount 103 and reflector 105 were fitted on a radiating board 104. The specific procedure was as follows. The submount and reflector were attached onto the radiating board with Sn—Ag—Cu based solder paste. The solder paste was applied onto the radiating board by a screen printing method. The metal mask thickness was 100μ. The size of the application area consisted of lands bounded by 1.2 mm side squares with 0.2 mm-width insulating sections separating the p- and n-electrodes at the centers (that is, two 1.2 mm×0.5 mm rectangular lands at a spacing of 0.2 mm) on the submount side, and a land bounded by a 6 mm-diameter circle on the outside and a 1.3 mm side square on the inside, on the reflector side. The light emitting element-mounted submount and reflector were set on the solder paste-coated radiating board with a transfer robot. The submount- and reflector-mounted radiating board was supplied to a reflow furnace on a conveyor and soldered. In the reflow furnace, two stage heating was carried out in a nitrogen atmosphere, wherein the temperature was raised to 175° C. during 80 seconds and held for 60 seconds, after which the temperature was raised to 235° C. during 30 seconds and held for 30 seconds.

The cap 101 was then mounted surrounding the light emitting element 102. The specific procedure was as follows. A base compound and curing agent were mixed at a weight ratio of 1:1 in a two-solution epoxy resin. The mixture was then thoroughly deaerated to remove the air bubbles in the resin, and the resin was injected into the depression of the cap with a dispenser and attached in a manner surrounding the light emitting element. The resin was then cured at 120° C. for 4 hours.

When a current test was carried out with the obtained light emitting device, the light extraction of the light emitting device of this example was found to be 1.86 times the light extraction of a bare-chip light emitting element.

The radiating board 104 may be a metal base sheet with satisfactory thermal conductivity such as iron, copper or aluminum, instead of a conventional electrical insulating, low-thermal conductivity printed circuit board, and an electrical insulation layer comprising an epoxy resin containing an added aluminum nitride filler with satisfactory thermal conductivity (hereinafter referred to as "thermally conductive resin layer") is coated on one side of it. A copper electrode circuit is formed thereon by etching, if necessary with reapplication of the thermally conductive resin layer as an electrical insulating protective layer, and formation of a copper circuit for reflector attachment by etching.

The reflector 105 is preferably made of a highly heat dissipating material such as iron, copper or aluminum, and its inner surface is mirror worked by polishing while the ground layer is Ni-plated and mirror finished by silver plating or aluminum vapor deposition.

The submount 103 on which this light emitting element is mounted is made by lamination and sintering of an aluminum nitride sheet with satisfactory heat dissipation, and an electrode pattern formed by Ni and silver plating of a tungsten surface is drawn on the light emitting element and radiating board mounted side. On the inside, the surface electrode patterns are penetrated by a "via" or electrical conductive cylindrical pin during lamination to achieve electrical conduction from the front to back sides for three-dimensional wiring.

The top of the light emitting element 102 is sealed with a sealing compound 106 filled into the depression of the cap 101 formed by the resin mold. The top surface of the cap 101 is the first light extraction surface, and its height is greater than the length of the longest diagonal of the light emitting element. This shape can reduce return of the photons from the light emitting element to the element itself and absorption of the photons by the element itself. The filled sealing compound protects the light emitting element, conductive wiring, etc. from the environment where the light emitting element is used. The sealing compound may be low melting point glass instead of a resin. As specific examples of suitable sealing compounds there may be mentioned epoxy resins, urea resins, silicone and other highly weathering resistant resins, or glass. Also, by adding a dispersing agent to the sealing compound, it is possible to moderate the light emitting properties of the element and increase the angle of visibility.

When a large current is applied to the light emitting element 102, heat produced in the light emitting element can damage the active layer. Thus, if the submount 103 is omitted from the assembly in order to lower the heat resistance, the flow of heat from the light emitting element is transmitted to the base metal sheet of the radiating board and to the metal reflector 105 through the heat transfer filler-containing resin layer of the radiating board 104, so that the heat resistance is reduced and the reliability of the light emitting element is improved.

As the coefficients of thermal expansion of the base metal sheet of the radiating board and of the submount 103 usually differ by a factor of about 3-4, the solder joints of the submount 103 and radiating board 104 are prone to cracking when the light emitting device is subjected to repeated heat cycles from low temperature (−40° C.) to high temperature (250° C.). The thermally conductive resin layer also has a function as a buffer layer to avoid cracking.

Comparative Example 1

Figure 16:
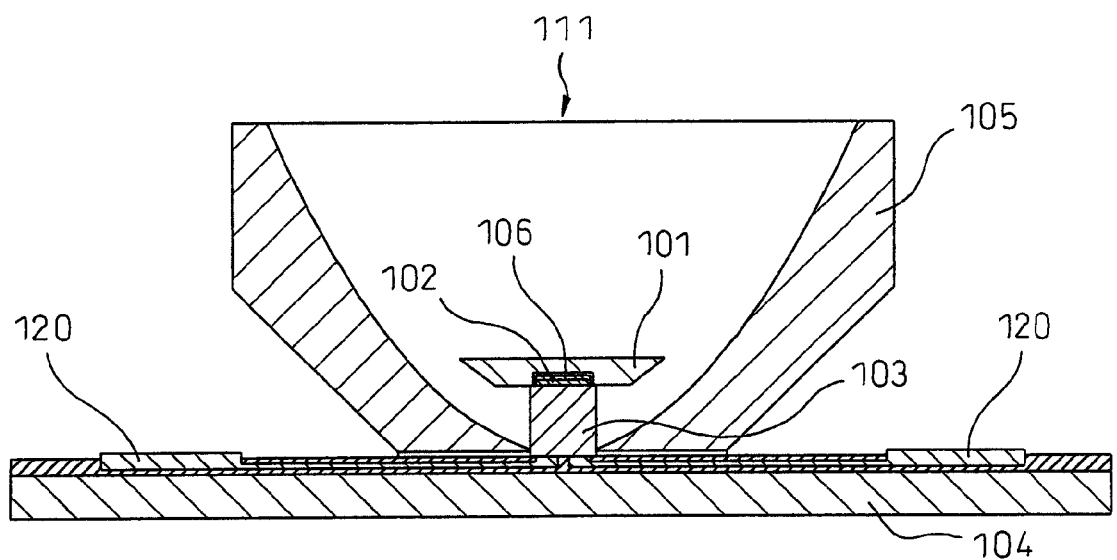
FIG. 16 is a cross-sectional view of the light emitting device fabricated in Comparative Example 1.

FIG. 16 shows a cross-sectional view of a light emitting device fabricated for this comparative example. A light emitting device was fabricated in the same manner as Example 1, except that the spacing between the top and bottom surfaces of the cap 101 was 0.75 mm, which was smaller than the longest diagonal of the semiconductor light emitting element 102. When the obtained light emitting device was subjected to a current test in the same manner as Example 1, the light extraction was approximately 1.6 times that of a bare chip.

Example 2

Figure 17:
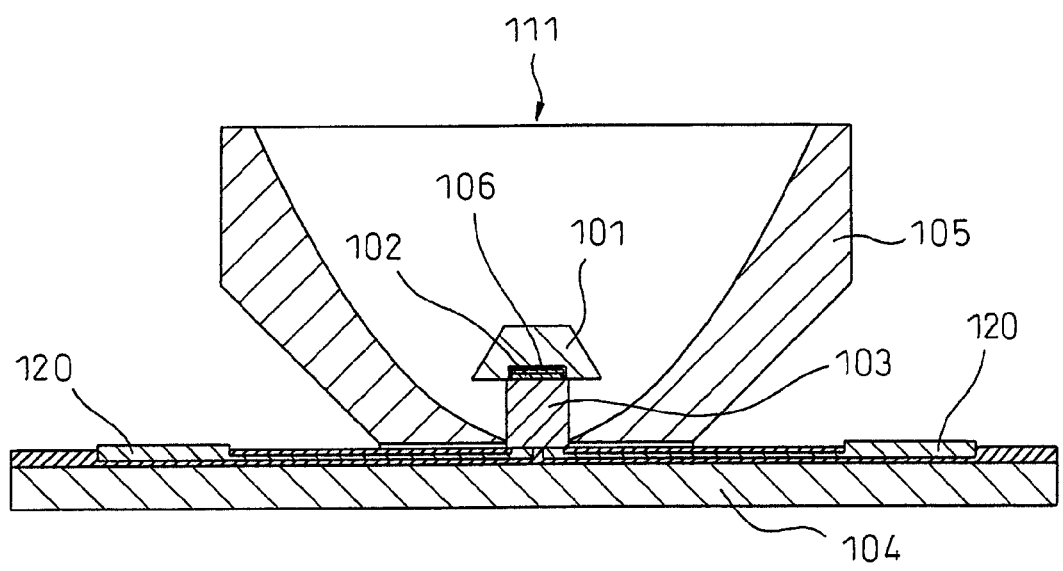
FIG. 17 is a cross-sectional view of the light emitting device fabricated in Example 2.

FIG. 17 shows a cross-sectional view of a light emitting device fabricated for this example. A light emitting device was fabricated in the same manner as Example 1, except that the shape of the cap 101 was a clipped conical shape with a top surface radius of 0.8 mm, a bottom surface radius of 1.6 mm and a height of 1.5 mm, so that the top and bottom surface area ratio was 1:4 and the top and bottom surface spacing was a distance greater than the longest diagonal of the light emitting element. When the obtained light emitting device was subjected to a current test in the same manner as Example 1, the light extraction was approximately 1.87 times that of a bare chip.

When the front brightnesses of the light emitting device of Example 1 and the light emitting device of Example 2 were compared, that of the light emitting device of Example 2 was 0.2 compared to 1 as the light emitting device of Example 1.

Comparative Example 2

Figure 18:
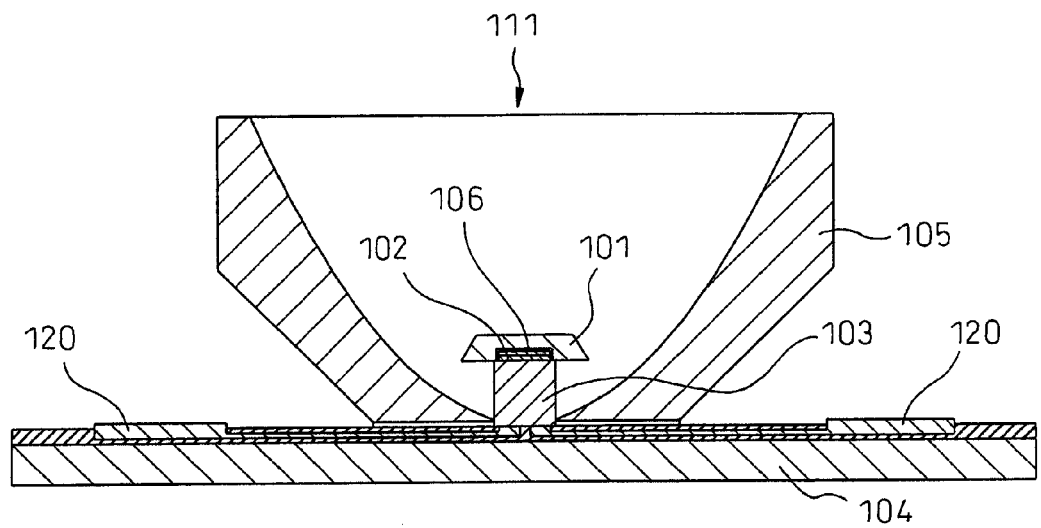
FIG. 18 is a cross-sectional view of the light emitting device fabricated in Comparative Example 2.

FIG. 18 shows a cross-sectional view of a light emitting device fabricated for this comparative example. A light emitting device was fabricated in the same manner as Example 2, except that the spacing between the top and bottom surfaces of the cap 101 was 0.75 mm, which was smaller than the longest diagonal of the semiconductor light emitting element 102. When the obtained light emitting device was subjected to a current test in the same manner as Example 1, the light extraction was approximately 1.6 times that of a bare chip.

Comparative Example 3

Figure 19:
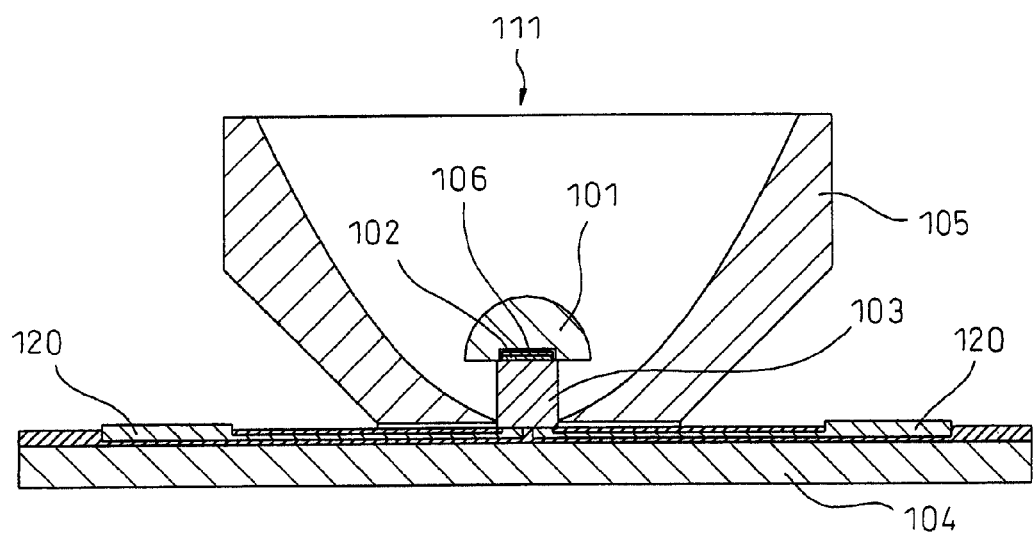
FIG. 19 is a cross-sectional view of the light emitting device fabricated in Comparative Example 3.

A light emitting device was fabricated in the same manner as Example 1, except that the cap shape was semi-circular with a radius of 1.0 mm, as shown in FIG. 19. This corresponds to a case where the side angle of a normal tapered cap is continuously varied. When the obtained light emitting device was subjected to a current test in the same manner as Example 1, the light extraction was approximately 1.82 times that of a bare chip.

Also, when the front brightnesses of the light emitting device of Example 1 and the light emitting device of Comparative Example 3 were compared, that of the light emitting device of Comparative Example 3 was 0.2 compared to 1 as the light emitting device of Example 1.

Industrial Applicability

Since the light emitting device of the invention has enhanced light extraction efficiency and high light emission output, and is therefore highly effective as an indoor or outdoor lighting device, automobile head lamp or the like, it has extremely high industrial value.

The invention claimed is:

1. A light emitting device comprising a board, a semiconductor light emitting element formed on the board optionally via a submount, a cap sealing the semiconductor light emitting element and a reflector provided surrounding the cap such that the reflector does not contact the cap, wherein the cap has top and bottom surfaces that are parallel to the top surface of the semiconductor light emitting element, and the spacing between the top and bottom surfaces is 1-3 times the longest diagonal or the diameter of the semiconductor light emitting element.

2. A light emitting device according to claim 1, wherein the area ratio of the top and bottom surfaces of the cap (top surface/bottom surface) is 4 or greater.

3. A light emitting device according to claim 1, wherein the ratio between the lengths of the corresponding sides or the diameters of the top and bottom surfaces of the cap (top surface/bottom surface) is 2 or greater.

4. A light emitting device according to claim 1, wherein the angle formed between the top surface and sides of the cap is 40° or smaller.

5. A light emitting device according to claim 1, wherein the area ratio of the top and bottom surfaces of the cap (top surface/bottom surface) is 1/4 or smaller.

6. A light emitting device according to claim 1, wherein the ratio between the lengths of the corresponding sides or the diameters of the top and bottom surfaces of the cap (top surface/bottom surface) is 1/2 or smaller.

7. A light emitting device according to claim 1, wherein the angle formed between the top surface and sides of the cap is 140° or larger.

8. A process for production of a light emitting device comprising a board, a semiconductor light emitting element formed on the board optionally via a submount, a cap sealing the semiconductor light emitting element and a reflector provided surrounding the cap such that the reflector does not contact the cap, wherein the cap has top and bottom surfaces that are parallel to the top surface of the semiconductor light emitting element, and the spacing between the top and bottom surfaces is 1-3 times the longest diagonal or the diameter of the semiconductor light emitting element, which process comprises bonding the cap onto the semiconductor light emitting element with a material having a refractive index that is not more than the refractive index of the cap.

* * * * *